United States Patent [19]

Schulz et al.

[11] Patent Number: 4,554,240

[45] Date of Patent: Nov. 19, 1985

[54] PHOTOSENSITIVE RECORDING MATERIAL WHICH CAN BE DEVELOPED WITH WATER, FOR THE PRODUCTION OF PRINTING PLATES, RELIEF PLATES OR RESIST IMAGES

[75] Inventors: Guenther Schulz, Ludwigshafen; Manfred Zuerger, Sinsheim, both of Fed. Rep. of Germany

[73] Assignee: BASF Aktiengesellschaft, Fed. Rep. of Germany

[21] Appl. No.: 624,283

[22] Filed: Jun. 25, 1984

[30] Foreign Application Priority Data

Jun. 25, 1983 [DE] Fed. Rep. of Germany ....... 3322994

[51] Int. Cl.$^4$ ................................................ G03C 1/68
[52] U.S. Cl. ..................... 430/285; 430/287; 204/159.14
[58] Field of Search ............... 430/287, 285, 288, 908, 430/909; 204/159.14

[56] References Cited

U.S. PATENT DOCUMENTS

| | | | |
|---|---|---|---|
| 2,929,710 | 3/1960 | Martin | 96/115 |
| 3,427,161 | 2/1969 | Leopold | 96/35.1 |
| 3,877,939 | 4/1975 | Okai | 96/36.3 |
| 4,247,624 | 1/1981 | Foss | 430/281 |
| 4,272,620 | 6/1981 | Ichimura | 430/287 X |

FOREIGN PATENT DOCUMENTS 786119 11/1957 United Kingdom .
834337  5/1960 United Kingdom .

*Primary Examiner*—John E. Kittle
*Assistant Examiner*—Cynthia Hamilton
*Attorney, Agent, or Firm*—Keil & Weinkauf

[57] ABSTRACT

A photosensitive recording material for the production of printing plates, relief plates or resist images comprises a photocurable relief-forming layer (RL) which is applied onto a dimensionally stable base and consists of (a) a water-soluble or water-dispersible polyvinyl alcohol derivative containing from 1 to 12 mole % of olefinically unsaturated photopolymerizable or photocrosslinkable side groups, in particular of α,β-olefinically unsaturated carboxylic acids, not more than 30 mole % of hydroxyl groups which are esterified and/or etherified with other non-olefinic radicals, and not less than 65 mole % of free hydroxyl groups and (b) one or more photopolymerization initiators, with or without (c) conventional non-photopolymerizable assistants and/or additives.

10 Claims, No Drawings

PHOTOSENSITIVE RECORDING MATERIAL WHICH CAN BE DEVELOPED WITH WATER, FOR THE PRODUCTION OF PRINTING PLATES, RELIEF PLATES OR RESIST IMAGES

The present invention relates to a photosensitive recording material for the production of printing plates, relief plates or resist images, which comprises a photocurable relief-forming layer (RL) which is firmly bonded to a dimensionally stable base and consists of a polyvinyl alcohol derivative containing olefinically unsaturated, photopolymerizable or photocrosslinkable side groups, and one or more photopolymerization initiators with or without conventional non-photopolymerizable assistants and/or additives.

Photosensitive recording materials which can be washed out with water or aqueous solutions and are used for the production of photopolymeric printing plates and relief plates are known per se and have been described in many publications (cf. for example British Pat. No. 834,337, U.S. Pat. Nos. 3,877,939 and 4,247,624, DE-A 31 28 949 and DE-A 31 44 905). The photopolymerizable relief-forming layer in these conventional photosensitive recording materials consists in general of a photoinitiator-containing mixture of a water-soluble or water-dispersible polyvinyl alcohol or polyvinyl alcohol derivative and olefinically unsaturated, photopolymerizable monomers. The primary purpose of the monomers is to effect adequate crosslinking of the photosensitive recording materials during imagewise exposure, so that the exposed and unexposed areas of the relief-forming layer exhibit a sufficient difference in solubility for the washout process. The use of photopolymerizable monomers in the photosensitive recording materials frequently not only necessitates an expensive treatment of the waste air in the preparation of the recording materials and disposal of the washout solutions obtained in the production of printing plates, but also presents toxicological problems for the user. The handling of such monomer-containing, photosensitive recording materials is therefore not without problems and involves substantial expenditure on safety. Moreover, most of the monomers which are compatible with polyvinyl alcohol, e.g. the hydroxyalkyl acrylates and methacrylates, give relatively brittle relief plates and printing plates which can scarcely be re-used or clamped on small cylinders.

It has furthermore been proposed to produce relief and lithographic printing plates from monomer-free photosensitive recording materials whose photocurable relief-forming layer contains, as the essential component, a polyvinyl alcohol derivative which possesses side groups containing olefinically unsaturated double bonds, e.g. acryloyl or methacryloyl groups (cf. for example U.S. Pat. No. 2,929,710, British Pat. No. 786,119 and DE-A-15 22 359). The polyvinyl alcohol derivatives which, according to these publications, are to be used in monomer-free photosensitive recording materials have been modified so substantially that they are no longer soluble or dispersible in water, and consequently these recording materials have to be washed out with an organic solvent after imagewise exposure. However, the use of water or aqueous solvents for the development of relief or printing plates is preferred.

It is an object of the present invention to provide photocurable recording materials for the production of printing plates, relief plates or resist images, in which the image can be easily developed with water or an aqueous solution after imagewise exposure to actinic light, which do not have the disadvantages of the conventional monomer-containing water-developable recording materials, in particular with regard to handling and compatibility, and which, in the exposed state, are nevertheless highly resistant to water. Moreover, the photosensitive recording materials should be easy to prepare and should possess good exposure properties and high resolution so that very good reproduction of fine lines and grids can be obtained during both washout and printing; the relief plates or resist images produced using the photosensitive recording materials should be flexible but sufficiently hard for printing, particularly for job printing, and should have a good uniform surface and a well defined relief structure.

We have found, surprisingly, that this object is achieved by photosensitive recording materials which comprise a monomer-free photocurable relief-forming layer which is firmly bonded to a base and contains, as the sole photopolymerizable or photocrosslinkable component, a special polyvinyl alcohol derivative possessing olefinically unsaturated, photopolymerizable or photocrosslinkable side groups.

The present invention accordingly relates to a photosensitive recording material for the production of printing plates, relief plates or resist images, comprising a photocurable relief-forming layer (RL) which is applied onto a dimensionally stable base and which consists of (a) a polyvinyl alcohol derivative which possesses olefinically unsaturated, photopolymerizable or photocrosslinkable side groups and (b) one or more photopolymerization initiators, with or without (c) conventional non-photopolymerizable assistants and/or additives, wherein the said layer (RL) contains, as component (a), a water-soluble or water-dispersible polyvinyl alcohol derivative which contains not less than 65 mole % of free hydroxyl groups, from 1 to 12 mole % of olefinically unsaturated, photopolymerizable or photocrosslinkable side groups and not more than 30 mole % of hydroxyl groups which are esterified and/or etherified with other, nonolefinic radicals.

In view of the prior art, it was surprising, and not foreseeable for a skilled worker, that, in spite of the fact that the polyvinyl alcohol derivative has a comparatively very low content of side groups containing olefinic double bonds, the novel photosensitive recording materials permit very good image reproduction which is faithful to the original and exact even in the very fine elements, lead, after exposure, to products which are very water-resistant, frequently even possessing better water-resistance than conventional products, give excellent prints even for very long print runs and can be reused many times, without the use of additional monomers being necessary. Compared with the conventional monomer-free photosensitive recording materials based on photocurable polyvinyl alcohol derivatives, the novel photosensitive recording materials not only can be developed with water but also have other substantial advantages in use, e.g. better shadow well depths in halftone areas and negative lines.

Suitable bases for the novel photosensitive recording materials are the dimensionally stable, rigid or flexible bases conventionally used for the production of printing plates, relief plates or resist images. These include, in particular, dimensionally stable plastic films, e.g. polyester films, and metallic bases, e.g. steel, iron or aluminum sheet. For the production of resist layers, it is also possible to use copper, copper-plated materials, printed circuits, etc. as bases for the photosensitive relief-forming layer (RL). The bases, in particular the metallic ones, can be pretreated mechanically, chemically and/or by coating them with an adhesive, the treatment being carried out in a conventional manner. To provide adequate adhesion between the base and the photocurable relief-forming layer (RL), one or more adhesive layers can be located between the base and the said layer (RL), particularly in the case of photosensitive recording materials for the production of printing plates and relief plates. The choice of base depends mainly on the intended use of the photosensitive recording materials. The conventional materials described in the relevant literature can be used for the adhesive layers between the base and the relief-forming layer (RL).

The photocurable relief-forming layer (RL) of the novel photosensitive recording materials contains, as component (a), a water-soluble or water-dispersible polyvinyl alcohol derivative which possesses side groups containing olefinically unsaturated, photopolymerizable or photocrosslinkable double bonds. For the purposes of the present invention, polyvinyl alcohols are, quite generally, polymers which are dispersible or soluble in water and possess repeating —CH$_2$CH(OH)— structural units in the polymer main chain. These include polyvinyl alcohol itself, copolymers of vinyl alcohol units and other comonomer units, and derivatives, e.g. ethers and/or esters, of polyvinyl alcohols. Particularly suitable polyvinyl alcohols from which the polyvinyl alcohol derivatives used according to the invention can be derived are the conventional partially hydrolyzed polyvinyl esters of monocarboxylic acids of 2 to 4 carbon atoms, especially the partially hydrolyzed polyvinyl acetates and/or polyvinyl propionates. The degree of hydrolysis of these partially hydrolyzed polyvinyl esters before derivatization with the olefinically unsaturated side groups and, if appropriate, other radicals is advantageously higher than 70, preferably from 80 to 95, mole %. The polyvinyl alcohols also include modified polyvinyl alcohols or partially hydrolyzed modified polyvinyl esters, for example copolymers of polyvinyl alcohol or partially hydrolyzed polyvinyl acetate, which copolymers contain, for example, from 10 to 30% by weight, based on the copolymer, of chemically bonded ethylene oxide units.

The water-soluble or water-dispersible polyvinyl alcohol derivatives used in accordance with the invention as component (a) should contain from 1 to 12 mole % of side groups possessing olefinically unsaturated, photopolymerizable or photocrosslinkable double bonds. Pre ferred side groups are those possessing activated olefinic double bonds, in particular double bonds which are conjugated or adjacent to oxygen or nitrogen. Particularly advantageous polyvinyl alcohols are those in which the olefinically unsaturated side groups are derived from α,β-olefinically unsaturated mono- or dicarboxylic acids of 3 to 10, in particular 3 or 4, carbon atoms, e.g. maleic acid, crotonic acid or in particular acrylic acid and/or methacrylic acid. The side groups possessing the photopolymerizable or photocrosslinkable olefinic double bonds are preferably bonded to the polymer main chain of the polyvinyl alcohol via ether or ester bonds. Polyvinyl alcohol derivatives possessing olefinically unsaturated side groups bonded via ether bonds are obtained by, for example, an etherification reaction of the polyvinyl alcohol with hydroxyl-containing monomers, in particular hydroxyl-containing derivatives of the above α,β-olefinically unsaturated carboxylic acids, e.g. N-methylolacrylamide, N-methylolmethacrylamide, hydroxyalkyl acrylates or methacrylates, such as β-hydroxyethyl acrylate or methyacrylate, etc. The olefinically unsaturated side groups can also be introduced into the polyvinyl alcohol by esterification with appropriate acylating agents, in particular the carboxylic anhydrides of α,β-olefinically unsaturated carboxylic acids of the stated type. Polyvinyl alcohol derivatives obtained by acylation of a polyvinyl alcohol with acrylic anhydride and/or methacrylic anhydride are particularly advantageous.

In addition to the olefinically unsaturated side groups, the water-soluble or water-dispersible polyvinyl alcohol derivatives used in accordance with the invention as component (a) can also contain not more than 30 mole % of converted hydroxyl groups which have been esterified and/or etherified with other, non-olefinic radicals; however, the polyvinyl alcohol derivatives should contain not less than 65 mole % of free hydroxyl groups. These other non-olefinic side groups are primarily acyl groups of saturated aliphatic or aromatic carboxylic acids. In the case of the preferably used, partially hydrolyzed polyvinyl acetates or polyvinyl propionates, these are, in particular, the residual acetyl or propionyl groups. However, it is also possible to incorporate other radicals, for example those possessing functional groups, into the polyvinyl alcohol by additional esterification or etherification of hydroxyl groups of the polyvinyl alcohol. For example, by acylating the polyvinyl alcohol with activated derivatives of dibasic or polybasic carboxylic acids, e.g. succinic anhydride or phthalic anhydride, it is possible to form the half-esters of these polybasic carboxylic acids and hence to prepare polyvinyl alcohol derivatives which possess side groups containing free carboxyl groups.

The polyvinyl alcohol derivatives used according to the invention preferably contain from 75 to 90 mole % of free hydroxyl groups, from 2 to 10 mole % of side groups possessing photopolymerizable or photocrosslinkable olefinic double bonds, and from 5 to 20 mole % of other, non-olefinic side groups. In general, the lower the content of other, non-olefinic side groups, the higher can be the proportion of olefinically unsaturated side groups in the water-soluble or water-dispersible polyvinyl alcohol derivatives. On the other hand, the proportion of olefinically unsaturated side groups in the polyvinyl alcohol derivative is kept low where the proportion of non-olefinic side groups is in the upper part of the stated range. The mean molecular weight (number average) of the polyvinyl alcohol derivatives is in general from 10,000 to 200,000, preferably from 15,000 to 100,000. The choice of the polyvinyl alcohol derivatives depends in particular on the intended use of the photosensitive recording materials and on the spectrum of properties desired for the printing plates, relief plates or resist images produced from these materials. The photocurable relief-forming layer (RL) of the novel recording materials can also contain, as component (a), a number of different polyvinyl alcohol derivatives of the type under discussion.

Although the polyvinyl alcohol derivatives which are used according to the invention and possess olefinically unsaturated side groups can be prepared by an conventional method, polyvinyl alcohol derivatives which have proven particularly advantageous for use according to the invention are those prepared by acylation of polyvinyl alcohols in the heterogeneous phase with acylating agents containing olefinically unsaturated photopolymerizable or photocrosslinkable groups. Particularly advantageous acylating agents in this context are the activated derivatives, in particular the carboxylic anhydrides, of $\alpha,\beta$-olefinically unsaturated carboxylic acids of 3 to 10, preferably 3 or 4, carbon atoms. Preferred acylating agents for the derivatization of the polyvinyl alcohols in the heterogeneous phase are crotonic anhydride, maleic anhydride and in particular acrylic anhydride and/or methacrylic anhydride.

The acylation of the polyvinyl alcohols in the heterogeneous phase with the acylating agents containing olefinic double bonds can be carried out, for example, by the method described in DE-A-31 44 905, using a large excess of the acylating agent, i.e. not less than twice the molar amount required to provide the desired degree of acylation. However, the derivatization of the polyvinyl alcohols in the heterogeneous phase with olefinically unsaturated acylating agents is very particularly advantageously carried out in the presence of a p-aminopyriding as a catalyst. Particularly suitable catalysts are p-aminopyridines which are disubstituted at the amino group by alkyl groups or a cyclic alkylene radical, in particular p-dimethylaminopyridine and p-pyrrolidinopyridine. The concentration of the p-aminopyridine catalyst is preferably from 0.1 to 15, in particular from 0.5 to 5, % by weight, based on the polyvinyl alcohol employed. In the acylation in the heterogeneous phase, it is also possible to employ, in addition to the p-aminopyridine catalyst, other tertiary amines, e.g. pyridine or triethylamine, as auxiliary bases, these being used in an amount of not more than 50, preferably from 5 to 20, % by weight, based on the polyvinyl alcohol employed. In the case of the p-aminopyridine-catalyzed acylation of the polyvinyl alcohols in the heterogeneous phase, the amount of the acylating agent can be from 1.1 to 1.5 times the molar amount required for the desired degree of conversion. The conversion of the polyvinyl alcohols to the polyvinyl alcohol derivatives possessing olefinically unsaturated side groups by acylation in the heterogeneous phase is advantageously carried out as follows: the polyvinyl alcohol is suspended in an aprotic dispersant and is then reacted with the acylating agent, in the presence or absence of a p-aminopyridine catalyst and with simultaneous vigorous mixing. Particularly suitable aprotic dispersants are lower halohydrocarbons, lower aliphatic ketones and aliphatic, cycloaliphatic and/or aromatic hydrocarbon solvents, e.g. methylene chloride, chloroform, carbon tetrachloride, trichloroethane, acetone, methyl ethyl ketone, methyl isobutyl ketone, hexane, cyclohexane, gasoline fractions, benzene, xylene and preferably toluene. The reaction temperature is kept at, in general, from 10° to 100° C., preferably from 40° to 80° C. It has proven advantageous to use the aprotic dispersant in an amount such that the suspension consisting of the polyvinyl alcohol and the dispersant contains from 30 to 75, in particular from 40 to 65, % by weight, based on the sum of polyvinyl alcohol and dispersant, of the dispersant.

We have found that, compared with other preparation processes, for example the reaction in solution, the preparation of the polyvinyl alcohol derivatives used according to the invention by acylation of a polyvinyl alcohol in the heterogeneous phase not only is simpler and cheaper but also gives polyvinyl alcohol derivatives which possess physical and chemical properties which permit them to be particularly advantageously used in the photosensitive recording materials. For example, the use of polyvinyl alcohol derivatives of the type under discussion, which have been prepared by acylation of polyvinyl alcohols in the heterogeneous phase with a p-aminopyridine catalyst, results in photosensitive recording materials which not only can be very readily developed with water but also possess improved water-resistance in the areas cured after exposure. Moreover, such recording materials possess better resolution, give more faithful reproductions and have an improved relief structure and surface, while the relief layer has improved mechanical properties.

The introduction of other, non-olefinic side groups into the polyvinyl alcohol, for example the above-mentioned side groups possessing free carboxyl groups, e.g. succinic acid or phthalic acid radicals, can be carried out simultaneously with, or separately from, the introduction of the olefinically unsaturated side groups, in an appropriate acylation reaction in the heterogeneous phase.

Apart from containing the polyvinyl alcohol derivatives of the type under discussion, which possess olefinically unsaturated side groups, the photocurable relief-forming layer (RL) of the novel recording materials contains one or more photopolymerization initiators. Suitable photopolymerization initiators, which can be employed individually or as a mixture with one another in the said layer (RL), are photoinitiators which are conventionally used for photosensitive mixtures, for example acyloins and their derivatives, such as benzoin, benzoin alkyl ethers, e.g. benzoin isopropyl ether, $\alpha$-methylolbenzoin and its ethers, e.g. $\alpha$-methylolbenzoin methyl ether, or $\alpha$-methylbenzoin or $\alpha$-methylbenzoin ethyl ether; vicinal diketones and their derivatives, e.g. benzil, benzil ketals, such as benzil dimethyl ketal, benzil methyl ethyl ketal, benzil methyl benzyl ketal or benzil ethylene glycol ketal; and in particular acylphosphine oxide compounds as described in, for example, DE-A-29 09 992 and DE-A-31 14 341 for use in photopolymerizable mixtures. Preferred typical initiators from the class comprising the acylphosphine oxides are 2,6-dimethoxybenzoyl-diphenylphosphine oxide, 2,4,6-trimethylbenzoyldiphenylphosphine oxide, ethyl 2,4,6-trimethylbenzoyl-phenylphosphinate and sodium 2,4,6-trimethylbenzoyl-phenylphosphinate. The photopolymerization initiators can also be used in conjunction with other co-initiators and/or activators, as described in the relevant literature.

It is frequently advantageous if, in addition to containing the polyvinyl alcohol derivative (component (a)) and the photoinitiator (component (b)), the photocurable relief-forming layer (RL) contains, as a further component (c), other conventional non-photopolymerizable assistants and/or additives. These include, in particular, thermal polymerization inhibitors, e.g. hydroquinone, hydroquinone derivatives, 2,6-di-tert.-butyl-p-cresol, nitrophenyls, N-nitrosoamines, such as N-nitrosodiphenylamine or the salts, in particular the alkali metal and aluminum salts, of N-nitrosocyclohexylhydroxylamine. For example, dyes, pigments, plasticizers, processing auxiliaries, etc. can also be present. Among the dyes, the soluble phenazinium, phenoxazinium, acridinium and phenothiazinium dyes are particularly important, e.g. Neutral Red (C.I. 50040), Safranine T (C.I. 50240), Rhodanil Blue, the salt or amide of Rhodamine B (Basic Violet 10, C.I. 45170), Methylene Blue (C.I. 52015), Thionine (C.I. 52025) and Acridine Orange (C.I. 46005). These dyes are used in general in amounts of from 0.0001 to 1% by weight, based on the total photocurable relief-forming layer (RL), and are preferably employed together with an adequate amount of a reducing agent which does not reduce the dye in the absence of actinic light but is capable of reducing it in the excited electronic state during exposure. Examples of such mild reducing agents are ascorbic acid, anethole, thiourea, diethylallylthiourea and hydroxylamine derivatives, in particular N-allythiourea and preferably salts of N-nitrosocyclohexylhydroxylamine, in particular the potassium and aluminum salts. The latter can also be present as thermal polymerization inhibitors in the photocurable relief-forming layer (RL), as stated above. The amount of added reducing agent is in general about 0.005–5, in particular 0.01–1, % by weight, based on the stated layer (RL), and the addition of from 3 to 10 times the amount of concomitantly used dye has proven useful in many cases.

The photocurable relief-forming layer (RL) of the novel photosensitive recording materials consists in general of (a) from 99.9 to 60, preferably from 99 to 84, % by weight of the water-soluble or water-dispersible polyvinyl alcohol derivative possessing olefinically unsaturated photopolymerizable or photocrosslinkable side groups, (b) from 0.1 to 5, preferably from 0.5 to 3, % by weight of the photopolymerization initiator and (c) from 0 to 35, preferably from 0.1 to 15, % by weight of the conventional non-photopolymerizable assistants and/or additives, these percentages being based in each case on the total photocurable relief-forming layer (RL). The components are matched with one another so that, after imagewise exposure, the photosensitive recording material can be developed with water. Depending on the intended use of the photosensitive recording material, the thickness of the said layer (RL) can vary within wide limits, and is generally from 25 to 2000 $\mu$m. For the production of letterpress printing plates and relief structures, the layer is preferably from 200 to 2000 $\mu$m thick.

The photocurable relief-forming layer (RL) can be applied directly onto the dimensionally stable base; however, depending on the materials used, it can, as stated above, also be firmly anchored to the base by means of an adhesion-promoting layer which is in general about 0.5–40 $\mu$m thick. Suitable adhesion-promoting layers are the conventional adhesives or mixtures of adhesive-forming components, for example 1-component or 2-component polyurethane-based adhesives or adhesion-promoting layers as described in DE-A-30 15 419.

Although it is also possible to apply a cover sheet and/or protective layer, consisting of, for example, polyvinyl alcohol having a high degree of hydrolysis, onto the photocurable relief-forming layer (RL) of the novel photosensitive recording material, such a cover sheet can as a rule be dispensed with in the novel recording materials since the said layer (RL) does not contain any volatile components, e.g. monomers, which can give rise to annoyance or require special safety measures during handling or processing of the photosensitive recording materials. This constitutes a further advantage of the novel recording materials.

The novel photosensitive recording materials are produced in a conventional manner by preparing and combining the individual layers. For example, the photocurable relief-forming layer (RL) can be prepared by mixing the components to give a homogeneous mixture, pressing, extruding or calendering, and can then be bonded to the base in a suitable manner, for example by lamination. Advantageously, the components of the said layer (RL) are dissolved in a solvent, preferably water, and the stated layer (RL) is cast from this solution onto the base. The components of the said layer (RL) which are not readily water-soluble are, if necessary, dissolved beforehand in water-miscible organic solvents, e.g. lower alcohols, lower ketones, tetrahydrofuran, etc., and the solutions obtained are then combined with the aqueous casting solution. After the photocurable relief-forming layer (RL) has been cast, the solvent is removed in a conventional manner and the layer is dried.

The photosensitive recording materials according to the invention are useful, for example, for the production of lithographic printing plates and of resists, as used, for example, for the production of printed circuits and integrated circuits, in semiconductor technology, in chemical milling techniques, etc., and in particular for the production of relief structures and letterpress printing plates, especially for job printing. For this purpose, the photocurable relief-forming layer (RL) of the photosensitive recording materials is exposed image-wise to actinic light in a conventional manner, and is developed by washing out the unexposed, non-crosslinked areas of the layer with water or an aqueous solution. Exposure can be carried out using a flat-plate exposure unit or a rotary, cylindrical unit, and suitable light sources are the conventional sources of actinic light, e.g. UV fluorescence tubes, high pressure, medium pressure or low pressure mercury lamps, superactinic fluorescent tubes, pulsed xenon lamps, metal halide-doped lamps, carbon arc lamps, etc. The wavelengths emitted should be in general from 230 to 450 nm, preferably from 300 to 420 nm and should be matched up with the characteristic absorption of the photoinitiator present. The relief image can be developed by spraying, washing, brushing, etc. with the aqueous developer. Because of the high water-resistance of the exposed photocured relief layer, the novel recording materials have the advantage that the washout conditions during the development with water can be made more severe without adversely affecting the printing plates, relief plates or resist images. On the contrary, this measure gives crisper relief structures. After the washout process, the resulting printing plate, relief plate or resist image is dried in a conventional manner, if required at as high as 120° C. In some cases it is advantageous to post-expose the resulting printing plate, relief plate or resist image uniformly to actinic light in order to increase the strength of the relief layer. The novel photosensitive recording materials give printing plates, relief plates and resist images which not only possess extremely high water-resistance, so that they have a long shelf life and good re-usability even in a warm moist climate, but also possess better shadow well depth and greater crispness than the conventional systems, and have a well defined relief structure, are very flexible and have a smooth surface.

The Examples which follow illustrate the invention. Parts and percentages are by weight, unless stated otherwise. The molecular weights of the polyvinyl alcohols (number average) have been determined via the viscosities, measured on a 4% strength by weight aqueous solution at 20° C. using a Hoppler viscometer.

EXAMPLE 1

1.1 100 parts of a partially hydrolyzed polyvinyl acetate having a degree of hydrolysis of 80 mole % and a molecular weight of 25,000 were suspended in 150 parts of acetone, and 50 parts of methacrylic anhydride and 1 part of 2,6-di-tert.-butyl-p-cresol were added. The inhomogeneous mixture was stirred for about 24 hours at 60° C., after which it was filtered through a suction filter. The resulting polyvinyl alcohol derivative contained 3 mole % of methacrylate side groups and 20 mole % of acetyl side groups (corresponding to 77 mole % of free hydroxyl groups).

1.2 98 parts of the polyvinyl alcohol derivative prepared in 1.1, together with 0.2 part of 2,6-di-tert.-butyl-p-cresol, were dissolved in 135 parts of water, and the resulting solution was mixed with a solution of 2 parts of benzil dimethyl ketal in 10 parts of ethanol. The resulting solution was used to produce a layer (RL) about 2 mm thick on a base consisting of a steel sheet coated with a polyurethane adhesive, and the applied layer (RL) was then dried.

1.3 The recording material prepared as described in 1.2 was processed to a relief printing plate in a conventional manner by exposing the layer (RL) imagewise, through an image-bearing transparency, to actinic light having a wavelength of 360 nm, and washing out the unexposed areas of the layer (RL) with water. The resulting printing plate was then dried and post-exposed uniformly to actinic light of the same wavelength. The printing plate obtained gave exact image reproduction, was very flexible and possessed excellent printing properties.

COMPARATIVE EXPERIMENT A

A mixture of 34 parts of β-hydroxyethyl methacrylate, 6 parts of tetraethyleneglycol dimethacrylate, 2 parts of benzil dimethyl ketal and 0.2 part of 2,6-di-tert.-butyl-p-cresol was added to a solution of 58 parts of the polyvinyl alcohol derivative prepared as described in Example 1.1, in 60 parts of water. The resulting solution was used to produce a photosensitive recording material by casting on a steel sheet, as described in Example 1.2, and the recording material obtained was processed to a relief printing plate, as described in Example 1.3. The printing plate obtained was substantially more brittle than the product obtained as described in Example 1.

EXAMPLE 2

2.1 100 parts of a partially hydrolyzed polyvinyl acetate having a degree of hydrolysis of 88 mole % and a mean molecular weight of about 30,000 were dispersed in a mixture of 180 parts of toluene, 20 parts of acrylic anhydride, 1 part of p-dimethylaminopyridine and 1 part of 2,6-di-tert.-butyl-p-cresol, and the dispersion was stirred for 12 hours at 80° C. The insoluble reaction product was filtered off, washed with toluene and acetone and dried. The resulting polyvinyl alcohol derivative contained, in bonded form, 5 mole % of acrylate side groups and 12 mole % of acetyl side groups (corresponding to 83 mole % of free hydroxyl groups).

2.2 A solution of 98 parts of the polyvinyl alcohol derivative prepared as described in Example 2.1, 2 parts of benzil dimethyl ketal and 0.2 part of 2,6-di-tert.-butyl-p-cresol in 135 parts of water was prepared as described in Example 1.2, and the solution was used to produce a layer (RL) about 1.4 mm thick on a base comprising a steel sheet coated with a polyurethane adhesive.

2.3 The recording material thus obtained was processed to a relief printing plate by imagewise exposure to actinic light, washing out of the unexposed areas of the layer (RL) with water and drying, using the procedure described in Example 1.3. The resulting printing plate can particularly advantageously be used for job printing.

The relief printing plate obtained is distinguished by high water resistance, good mechanical stability and crisp side walls of the relief structures. The post-exposure can be dispensed with.

EXAMPLE 3

The procedure described in Example 2 was followed, except that, in the preparation of the photosensitive layer (RL), the di-tert.-butyl-p-cresol was replaced by 0.2 part of the potassium salt of N-nitrosocyclohexylhydroxylamine, and 0.02 part of Safranine T (C.I. 50240) was employed in addition. The resulting relief plate had improved shadows and relief structure. The recording material permitted greater latitude of exposure, and it was possible to choose shorter exposure times.

We claim:

1. A photosensitive water-developable recording material for the production of printing plates, relief plates or resist images, which comprises a photocurable relief-forming layer (RL) which is applied onto a dimensionally stable base, which layer (RL) includes
   (a) as the sole photopolymerizable or photocrosslinkable component, a water-soluble or water-dispersible polyvinyl alcohol derivative which contains not less than 65 mole % of free hydroxyl groups, from 1 to 12 mole % of side groups possessing olefinic photocrosslinkable double bonds, and from 0 to 30 mole % of hydroxyl groups which are esterified and/or etherified with other, non-olefinic radicals and
   (b) one or more photopolymerization initiators.

2. A photosensitive recording material as set forth in claim 1, wherein the water-soluble or water-dispersible polyvinyl alcohol derivative contains from 75 to 90 mole % of free hydroxyl groups, from 2 to 10 mole % of olefinically unsaturated photopolymerizable or photocrosslinkable side groups and from 5 to 20 mole % of other non-olefinic side groups.

3. A photosensitive recording material as set forth in claim 1, wherein the water-soluble or water-dispersible polyvinyl alcohol derivative is derived from a partially hydrolyzed polyvinyl ester of a monocarboxylic acid of 2 to 4 carbon atoms.

4. A photosensitive recording material as set forth in claim 3, wherein the water-soluble or water-dispersible polyvinyl alcohol derivative is derived from partially hydrolyzed polyvinyl acetate.

5. A photosensitive recording material as set forth in claim 1, wherein the olefinically unsaturated photopolymerizable or photocrosslinkable groups present in the polyvinyl alcohol derivative are radicals or derivatives of α,β-olefinically unsaturated carboxylic acids of 3 to 10 carbon atoms.

6. A photosensitive recording material as set forth in claim 5, wherein the α,β-olefinically unsaturated carboxylic acids are acrylic acid and/or methacrylic acid.

7. A photosensitive recording material as set forth in claim 5, wherin the photocurable relief-forming layer (RL) contains, as component (a), a water-soluble or water-dispersible polyvinyl alcohol derivative which is obtained by reacting a partially hydrolyzed polyvinyl acetate or polyvinyl propionate with an anhydride of an α,β-olefinically unsaturated carboxylic acid of 3 to 10 carbon atoms in the heterogeneous phase in the presence of, as a catalyst, a p-aminopyridine which is disubstituted at the amino group.

8. A photosensitive recording material as set forth in claim 1, wherein the polyvinyl alcohol derivative additionally contains free carboxyl groups.

9. A photosensitive recording material as set forth in claim 1, wherein the mean molecular weight of the polyvinyl alcohol derivative is from 10,000 to 200,000.

10. A photosensitive recording material as set forth in claim 1, wherein the photocurable relief-forming layer (RL) consists of
(a) from 99.9 to 60% by weight of the water-soluble or water-dispersible polyvinyl alcohol derivative,
(b) from 0.1 to 5% by weight of photoinitiators and
(c) from 0 to 35% by weight of conventional non-photopolymerizable assistants and/or additives.

* * * * *